United States Patent [19]
Knapp

[11] Patent Number: 5,325,442
[45] Date of Patent: Jun. 28, 1994

[54] FINGERPRINT SENSING DEVICE AND RECOGNITION SYSTEM HAVING PREDETERMINED ELECTRODE ACTIVATION

[75] Inventor: Alan G. Knapp, Crawley, England

[73] Assignee: U.S. Philips Corporation, New York, N.Y.

[21] Appl. No.: 20,883

[22] Filed: Feb. 19, 1993

Related U.S. Application Data

[63] Continuation of Ser. No. 701,550, May 16, 1991, abandoned.

[30] Foreign Application Priority Data

May 18, 1990 [GB] United Kingdom ............... 9011163

[51] Int. Cl.$^5$ ..................... G06K 9/00; H01G 7/00
[52] U.S. Cl. ........................... 382/4; 361/278; 361/283.1
[58] Field of Search ............... 355/40 IP; 361/278, 361/280, 283, 286; 73/718, 724; 324/660, 661, 662, 663, 699; 382/2, 4, 5; G06K 9/00; H01G 7/00

[56] References Cited

U.S. PATENT DOCUMENTS

| | | | |
|---|---|---|---|
| 4,353,056 | 10/1982 | Tsikos | 382/4 |
| 4,394,773 | 7/1983 | Ruell | 382/4 |
| 4,429,413 | 1/1984 | Edwards | 382/4 |
| 4,547,898 | 10/1985 | Tsikos | 382/4 |
| 4,577,345 | 3/1986 | Abramov | 382/4 |
| 4,582,985 | 4/1986 | Lofberg | 382/4 |
| 4,852,443 | 8/1989 | Duncan et al. | 361/278 |
| 4,986,136 | 1/1991 | Brunner et al. | 361/283 |

FOREIGN PATENT DOCUMENTS 0343580 11/1989 European Pat. Off. ............... 382/4

OTHER PUBLICATIONS

C. J. Elliott entitled "Automatic Fingerprint Recognition" in Parallel Processing State of the Art Report published in 1987 by Pergamon Infotech.

Fukue et al entitled "Fingerprint Verification System-Verification Algorithm" published in IEEE TENCON 87, Seoul, 1987 at pp. 71–75.

*Primary Examiner*—Jose L. Couso
*Attorney, Agent, or Firm*—Richard A. Weiss

[57] ABSTRACT

A Fingerprint sensing device and a recognition system having a row/column array of sense elements which are coupled to a drive circuit and a sense circuit by sets of row and column conductors, respectively. The sense elements are actively addressable by the drive circuit. Each sense element contains a sense electrode and a switching device (e.g., a TFT) for active addressing of that sense electrode. The sense electrodes of the sense elements are covered by insulating material adapted for receiving, directly thereon or on respective conductive pads overlying the sense electrodes, a finger. Capacitances resulting from individual finger surface portions in combination with sense electrodes are sensed by the sense circuit by applying a potential to the sense electrodes and measuring charging characteristics. In the fingerprint recognition system, an output from the sensing circuit is analyzed and characteristical data is compared with stored characteristical data for identification and verification purposes.

27 Claims, 5 Drawing Sheets

FINGERPRINT SENSING DEVICE AND RECOGNITION SYSTEM HAVING PREDETERMINED ELECTRODE ACTIVATION

This is a continuation of application Ser. No. 07/701,550, filed May 16, 1991, now abandoned.

BACKGROUND OF THE INVENTION

This invention relates to fingerprint recognition systems and particularly fingerprint sensing devices for use in such systems.

Fingerprint recognition has been suggested for many applications, ranging from high security uses such as access control for buildings, computers or the like to low security uses such as replacements for conventional locks and keys. The main advantages of such systems are that they are easy and convenient to use, avoid the need for keys, personal identification numbers and the like, and should be less susceptible to fraudulent use. The sensing device is an important part of the system and the quality of the representation of the fingerprint that the device picks up will affect recognition capability and the amount of preprocessing required for verification.

Conventional forms of fingerprint sensing devices rely on optical detection methods. A simple optical sensing method can be open to fraudulent use by presenting a photographic image of a fingerprint. A more secure and common approach is to use a glass prism with frustrated total internal reflection. Light is directed through one face, reflected at a second face and passes out at the third face. A finger is placed on the second face and at the points where the finger is in contact with the glass, i.e. at the ridges of the fingerprint, reflection no longer takes place. Light continues to be reflected at regions where troughs of the fingerprint pattern are present. Light output from the third face is picked up by an image sensor. A binary image, in which those parts of the fingertip in contact with the glass show as black and the rest as white, can therefore be obtained. Such an optical sensing device has disadvantages however. For example, the device is comparatively bulky. Also it is essential that the contact surface be maintained clean and free of dirt or grease. Moreover, problems can occur because some people have drier fingers than others and because most people's fingers become drier in cold weather. A dry finger actually touches the glass at many fewer points than a moist finger with the result that the lines of the fingerprint appear as rows of small dots so that more image processing becomes necessary.

An alternative kind of fingerprint sensor was proposed in U.S. Pat. No. 4,353,056 which uses a capacitive sensing approach. The described sensor has a two dimensional, row and columm, array of capacitors, each comprising a pair of spaced electrodes, carried in a sensing member and covered by an insulating film. The sensors rely upon deformation to the sensing member caused by a finger being placed thereon so as to vary locally the spacing between capacitor electrodes, according to the ridge/trough pattern of the fingerprint, and hence, the capacitance of the capacitors. In one arrangement, the capacitors of each column are connected in series with the columns of capacitors connected in parallel and a voltage is applied across the columns. In another arrangement, a voltage is applied to each individual capacitor in the array. Sensing in the respective two arrangements is accomplished by detecting the change of voltage distribution in the series connected capacitors or by measuring the voltage values of the individual capacitances resulting from local deformation. To achieve this, an individual connection is required from the detection circuit to each capacitor.

While the described sensor may not suffer form the problems associated with the kind of sensor employing an optical sensing technique, it suffers from its own problems. For example, because the sensor relies in operation on deformation and requires the use of resilient materials, problems with durability and reliability may be experienced. Moreover, the need to provide a respective connection to each individual capacitor in the array means that a very large number of connecting lines is necessary. This creates difficulties, both in the fabrication of the sensing member and its interconnection with the detection circuit. In practice the large number of connections would likely also cause operating difficulties due to stray capacitances.

SUMMARY OF THE INVENTION

It is an object of the present invention to provide an improved sensing device which uses a capacitive sensing approach but which avoids at least to some extent the aforementioned problem.

According to a first aspect of the present invention, there is provided a fingerprint sensing device comprising an array of sense elements which are connected to a drive circuit and which each comprise a sense electrode. The sense electrodes are covered by dielectric material defining a sensing surface over which a finger whose print is to be sensed is placed. Each sense element includes a respective switching device connected to its sense electrode and is actively addressable by the drive circuit controlling operation of the switching device so that a predetermined potential can be applied to the sense electrode, and the sensing device further includes sensing circuit for sensing a capacitance produced by individual finger surface portions in combination with respective sense electrodes when a finger is placed over said sensing surface.

Active addressing of the sensing elements, made possible by the provision of a switching device in each sensing element, greatly simplifies driving of the array and allows the number of addressing conductors required to be considerably reduced, as will become apparent. Such a sensing device can also be produced in a very compact form, and, therefore, is easily accommodated in various equipment.

In use, the presence of a finger surface portion overlying a sense electrode produces a respective capacitor whose capacitance is sensed. Assuming the sensing surface is constituted simply by the surface of the dielectric material, then if a finger is placed over the sensing surface the ridges of the fingerprint may be in contact with or at least close to that surface whereas the troughs are spaced further away. A capacitor is then formed by each sense electrode in combination with the respective overlying portion of the finger surface, with the electrode and finger surface portion, the latter being at ground potential, constituting respective capacitor plates. In the case of the finger surface, portion being a ridge which contact the surface the capacitor plates are separated by the thickness of the dielectric layer; whereas, in the case of the finger surface portion being a trough, the plates are separated by the combined thickness of the dielectric layer and the air gap between the finger surface portion and the surface of the dielectric layer. A pattern of capacitor values is, therefore, obtained over the area of the array representative of the variation in distance of the skin surface from the dielectric layer surface, and, thus, in accordance with the three-dimensional ridge pattern of the fingerprint. No deformation of the sense element array is required. By measuring the variation of these capacitances, an electronic representation or image of the fingerprint pattern can be obtained. Because this representation is indicative of the three-dimensional form of the fingerprint pattern, as compared with merely a two-dimensional representation provided by the aforementioned optical kind of sensing device. At the same time, the capacitive sensing approach utilized means wherein the effects of dirt or grease present in normal circumstances on the sensing surface or the use of comparatively dry fingers will be less significant.

An array of discrete electrodes may be provided over the surface of the dielectric material, each of which substantially overlies a respective sense electrode. In this arrangement, each additional electrode together with its associated sense electrode constitute capacitor plates separated by the dielectric material. Different capacitance values are obtained depending on whether or not a fingerprint ridge contacts the additional electrode, thereby grounding it. Such a device, therefore, provides basically a standard, predetermined, capacitance value wherever contacting fingerprint ridges are present. Where troughs overlie sensing electrodes, the capacitance values obtained are again determined by the spacings. By detecting simply where these predetermined capacitances exist, a kind of binary "image" of the fingerprint, similar to those provided by optical sensing devices, can easily be produced, if desired.

The drive circuit is operable such that at regular intervals a predetermined potential is applied to the sense electrode. Between successive applications of a predetermined potential, the charge on the sense electrodes maybe removed or reduced, for example, by means of a grounded resistor, or alternatively, the value of the predetermined potential may be changed for successive applications. Because each sense electrode forms part of a capacitor in the presence of a finger, the magnitude of the charge flowing into the capacitor depends on the size of the capacitor, which is determined by the spacing of the finger surface from the sensor surface. In order to provide an indication of the capacitor size, the device may conveniently include, for example, charge sensitive amplifiers, for sensing the charging current to each of the electrodes and generating a signal output in accordance therewith which can be used in subsequent signal processing. It is envisaged, however, that other ways of sensing the capacitor values could be employed.

The switching device of each sense element may comprise a three terminal device such as a field effect transistor whose source and drain are connected respectively to the sensing circuit via a sense conductor and the associated sense electrode and which is controlled by means of a select, or gating, signal applied by the drive circuit to its gate via an address conductor. The sense elements are preferably in a row and column array and in this case the gates of the transistors associated with the sense elements of one row share a respective common address conductor and the sources of the transistors associated with one column share a respective common sense conductor. The sense elements can then be addressed conveniently a row at a time to build up a complete "image" of the capacitor values. In these respects, the sensing device shares similarities with active-matrix addressed display devices with regard to the addressing technique employed. Moreover, the sensing device may conveniently be fabricated using the same kind of matrix switching technology developed for such display devices using thin film deposition and photolithographic definition processes to form electrodes, addressing conductors and thin film transistors on an insulative substrate. Alternatively, the sensing device may be fabricated using a semiconductor wafer and integrated circuit technology. In both cases it will be appreciated that the sensing device is considerably less bulky than conventional devices.

The dielectric material, comprising any suitably insulative material such as, for example, silicon nitride or a polyimide, may conveniently be provided as a continuous layer, preferably of uniform thickness, over the array of sense electrodes and intervening spaces following their formation. Further conductors may be provided on the surface of the dielectric material remote from the sense electrodes and extending over regions between the sense electrodes, for example, as lines or in a grid form, which conductors are grounded in order to improve the electrical contact to the finger surface.

According to a second aspect of the present invention, there is provided a fingerprint recognition system comprising a sensing device in accordance with the first aspect of the invention. An analysis circuit responsive to an output from the sensing circuit of the device to provide characteristical data of a sensed fingerprint, and a computer for comparing the characteristical data with stored characteristical data for one or more fingerprints. An output can be obtained from the sensing device comparable to the video output provided by an image sensor in an optical sensing device. Accordingly, and as will be apparent to skilled persons, components of the system, other than the sensing device, can be generally of the kind employed in systems using optical sensing devices. The characteristical data in accordance with standard practice may take the form of information regarding the orientation of ridge lines and relative positions of minutiae, that is the ending and bifurcations of the lines. The processing of information obtained from the sensing device to produce and compare characteristical data can follow known schemes and techniques. In this respect, reference may be made, for example, to EP-A-0343580, the paper by C. J. Elliott entitled "Automatic Fingerprint Recognition" in Parallel Processing: State of the Art Report published in 1987 by Pergamon Infotech, or the paper by Fukue et al entitled "Fingerprint Verification System-Verification Algorithm" published in IEEE TENCON 87, Seoul, 1987 at pages 71–75. Because the sensing device of the invention can provide information of the three dimensional profile of a fingerprint, improved accuracy of identification or verification can be obtained by making use of topological features in addition to the spatial positions of minutiae. Although, of course, use may be made only of information in respect of the two-dimensional ridge patterns to simplify the processing necessary if less accuracy is acceptable.

BRIEF DESCRIPTION OF THE DRAWINGS

Embodiments of fingerprint sensing devices, fingerprint recognition systems and methods used therein in accordance with the invention will now be described, by way of example, with reference to the accompanying drawings, in which:

FIGS. 6a-c illustrate typical waveforms present in operation of the sensing device;

It should be understood that the Figures are merely schematic and are not drawn to scale. In particular certain dimensions such as the thickness of the layers or regions may have been exaggerated while other dimensions may have been reduced. It should also be understood that the same reference numerals are used throughout the Figures to indicate the same or similar parts.

DESCRIPTION OF THE PREFERRED EMBODIMENTS

Figure 1:
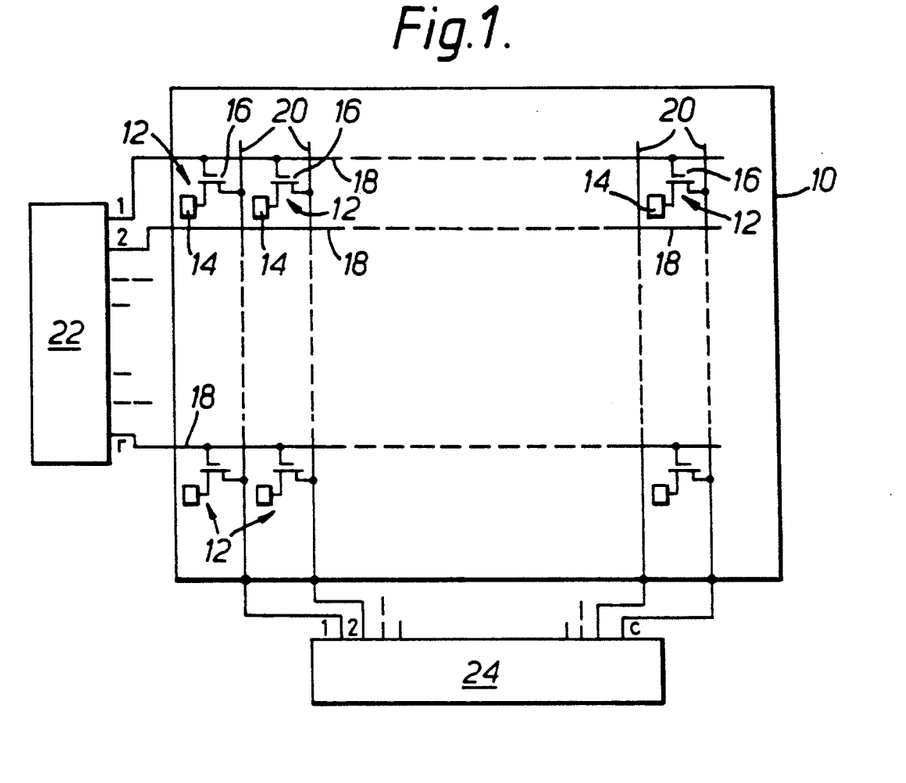
FIG. 1 is a simplified schematic diagram of an embodiment of sensing device in accordance with the invention showing an array of the sense elements together with associated addressing circuitry.

Referring to FIG. 1, the sensing device comprises an active matrix addressed sensing pad 10 having a X-Y array of sense elements consisting of r rows (1 to r) with c sensing elements 12 in each row. Only a few rows and columns are shown for simplicity. In practice there maybe around 300 rows and 00 columns of regularly-spaced elements occupying an area of approximately 2 cms by 3 cms.

Figure 2:
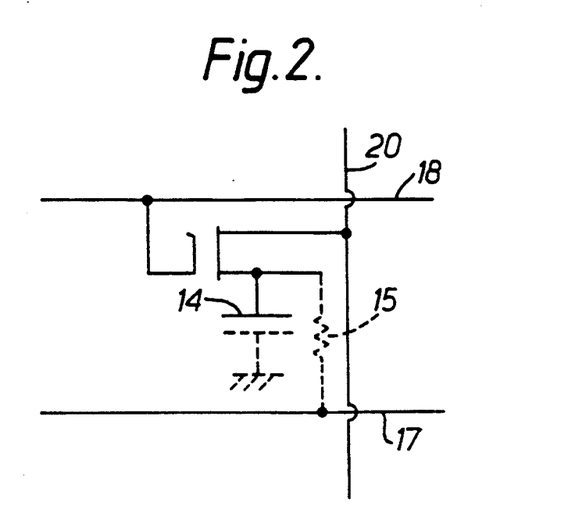
FIG. 2 shows schematically the equivalent circuit for a typical sense element of the device, comprising a sense electrode and associated switching device.

Referring also to FIG. 2, each sense element of the array comprises a sense electrode 14 connected to an active device, which in this embodiment comprises a three terminal switching device 16 in the form of a field effect transistor (FET). The X-Y array of sense elements is addressed via sets of row (selection) and column (sensing) address conductors 18 and 20, respectively, with individual sense elements being located at respective intersections of the conductors. All sense elements in the same row are connected to a respective common row conductor 18 and all sense elements in the same column are connected to a respective common column conductor 20. The row conductors 18 are connected at their one ends to a row driver circuit, generally referenced at 22, and the column conductors 20 are connected at their one ends to a sensing circuit, 24.

As can be seen in FIG. 2, the gate and source of the FET 16 of a sense element are connected respectively to a row conductor 18 and a column conductor 20. The FET's drain electrode is connected to the sense electrode 14.

Fabrication of the sense elements 12 and address conductors 18 and 20 of the pad 10 is based on technology used in active matrix addressed display devices, such as liquid crystal display devices. This technology is now well established as a means for producing large area active matrix arrays, and, as such, it is considered unnecessary to describe here in detail the methods by which the sensing device can be fabricated. Briefly, the method typically involves the deposition and definition by photolithographic processes of a number of layers on an insulating substrate. The electrodes 14 and sets of address conductors 18 and 20 can be formed of metal and the FETs 16 can be formed as amorphous silicon or polycrystalline silicon thin film transistors (TFTs) using an appropriate, e.g., glass or quartz, substrate.

Figure 3:
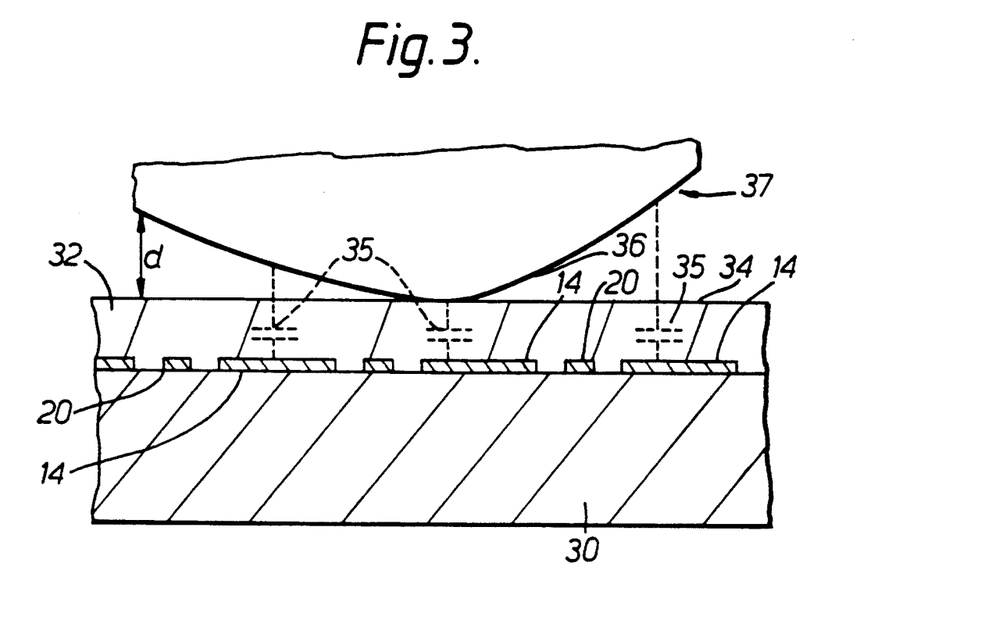
FIG. 3 is a schematic cross-sectional view through a part of the sensing device illustrating its operation.

An example of one form of construction is shown schematically in FIG. 3 which is a cross-section through a representative part of the pad 10 comprising three complete sense electrodes 14. The TFT structures, which have been omitted for clarity, are formed on a glass or quartz substrate 30, by depositing a layer of amorphous or polycrystalline silicon material over the substrate and defining this layer to leave individual islands which eventually form the TFT's channels. Similarly a layer of insulating material, for example, silicon nitride, is deposited and defined to form the gate insulator layers of the TFTs. The electrodes 14, comprising regularly spaced and equally sized rectangular pads, and the set of address conductors 20 extending therebetween are defined from a deposited metal layer. Integral extensions of the electrodes 14 and conductors 20 respectively form the drain and source contacts of the TFTs. Further insulating material is provided, over the conductors 20 at least at the regions where they are to intersect the address conductors 18. The set of conductors 18, not visible in FIG. 3, is then formed from a deposited metal layer with each conductor extending between adjacent rows of electrodes 14 and having integral extensions along its length which overlie respective semiconductor islands and serve as gate electrodes of the TFTs. The resulting structure is similar to the active matrix structure of a display device with the sets of address conductors 18 and 20 and sense electrodes 14 being analoguous, respectively, to the sets of gating and signal conductors and display element electrodes of a display device. Fabrication is, however, made simpler in view of the fact that metal is used for the electrodes 14 rather than transparent conductive material, such as ITO, which is necessary for display element electrodes in a display device.

To complete the structure of the sensing device, an insulating film 32, for example, of silicon nitride or polyimide, is deposited completely over the structure on the substrate 30 to provide a continuous sensing surface 34 spaced from, and substantially parallel to, the substrate surface.

The physical dimensions of the sense electrodes are chosen in accordance with the desired resolution characteristics in fingerprint sensing. By way of example, the sense electrodes may have a pitch of around 100 micrometers in both the row and column directions. The thickness of the insulating film 32 is selected taking into account the particular material used for this film. For example, in the case of a material having a relative permittivity of approximately 4, a film thickness of around 4 micrometers is chosen.

In operation of this sensing device, a finger whose print is to be sensed is placed on the sensing surface 34. Actual, or close, physical contact with the surface 34 then occurs at the ridges of the finger surface, as illustrated in FIG. 3 where one ridge 36 of part of the finger surface 37 is depicted. Troughs in the finger surface adjacent to the ridges are spaced from the surface 34 by a considerably greater distance. The ridged finger surface is therefore spaced from the array of electrodes 14 by a minimum distance determined by the thickness of the thin insulating film 32. Each sense electrode 14 and the respective overlying portion of the finger surface form opposing plates of a capacitor 35, as depicted by dotted lines in FIG. 3, with the plate constituted by the finger surface portion being at ground potential. The intervening material of the insulating film 32, and air gap, between the finger surface portion and the sensing surface 34, if present, provide the capacitor dielectric. The capacitances of these individual capacitors varies as a function of the spacing, d in FIG. 3, between the finger surface and the sensing surface 34, with the larger capacitances occuring where the finger surface ridges are in contact with surface 34 and the smaller capacitances occuring where the troughs in the finger surface overlie the sense electrodes 24.

Figure 4:
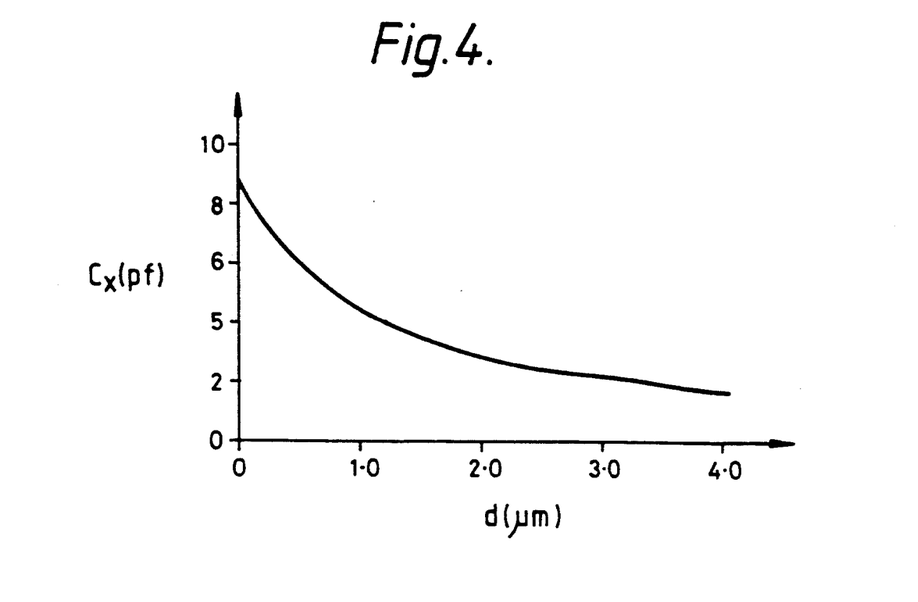
FIG. 4 illustrates graphically the relationship between capacitance and finger surface distance for a typical sense electrode of the device.

This variation in capacitance is illustrated in FIG. 4 in which the relationship between the capacitance Cx, in picofarads per square millimeter, of a capacitor 35 and the spacing d, in micrometers is shown graphically for the case in which the insulating film is of a material having a relative permittivity of 4 and is 4 micrometers in thickness. The variation in capacitances produced over the array of sensing elements 12 of the pad 10 by a fingerprint ridge pattern thus constitutes in effect an electronic "image" of the three dimensional form of the fingerprint surface. These capacitances are sensed within the sensing device, and an output indicative of the variation, and, hence the three-dimensional profile of the fingerprint, is provided. The three dimensional ridge pattern of a fingerprint is reproduced in the form of an electronic image by monitoring the capacitance variation between the individual sense electrodes in the array and the ridged finger surface. Because the variation in capacitances is determined by the three dimensional form of the finger, any attempt at fraudulent use by producing a dummy finger is made very difficult.

Sensing the capacitance variation between the various sense elements 12 in the array is accomplished as follows. Each sense element is addressed through its associated row (selection) and column (sensing) conductors 18 and 20. A gating pulse applied to a row conductor 18 by the row driver circuit 22 turns on the FETs 16 of all sense elements 12 in the row of elements associated with the row conductor. A predetermined potential of around 10 volts is simultaneously applied by the circuit 24 to all column conductors 20 so that upon the FETs 16 being turned on the capacitors 35 associated with the sense elements 12 of that row are charged to the potential of the column conductors. The charging current for the capacitors flows up the column conductors 20 and is sensed by an appropriate amplifier within the circuit 24. The magnitude of the charge flowing into each capacitor 35 depends on the size of the capacitor. Therefore, by measuring the charging currents in each column conductor 20 the size of each capacitor can be assessed. This procedure is repeated for each row of sensing elements of the array in turn sequentially so that a complete "image" of the capacitor characteristics is built up following the addressing of all rows in the array in one complete field period.

Figure 5A:
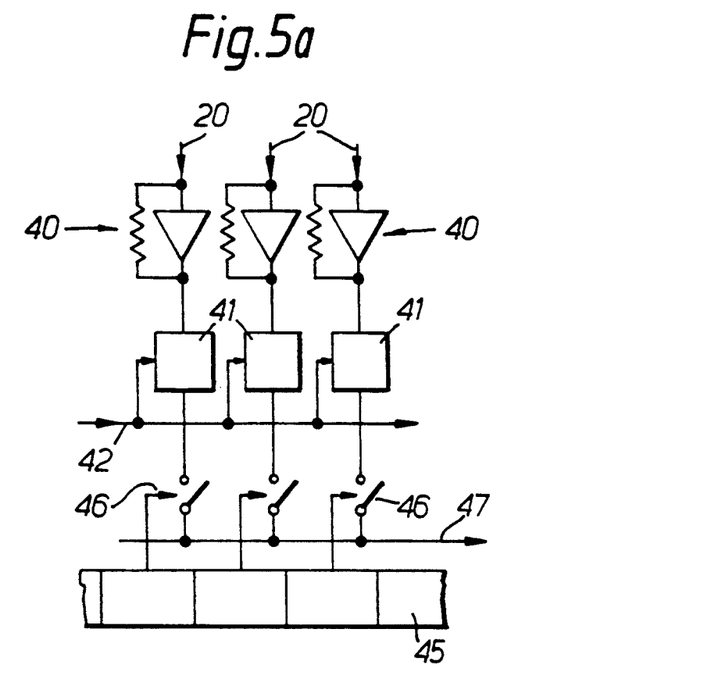
FIGS. 5a and 5b show respectively parts of two alternative sensing circuits of the sensing device.
Figure 5B:
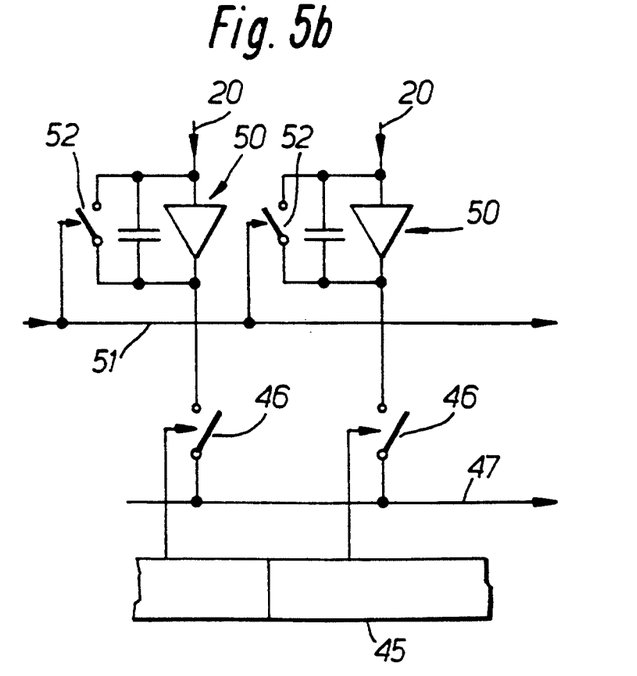

FIGS. 5a and 5b respectively illustrate two alternative sensing circuits which may be used to sense the charging characteristics of the capacitors. FIG. 5a shows a part of current sensing circuit configuration for three adjacent column conductors 20. The column conductors 20 are connected to respective current amplifiers 40 with resistive feedback whose outputs are supplied to sample and hold circuits 41. The bias condition of the amplifiers sets the aforementioned predetermined potential level on the column conductors 20. These circuits 41 are operated simultaneously, and in synchronism with the gating pulse applied to a row conductor 18, by means of a sampling pulse supplied along a common line 42. The analog outputs of the circuits 41 are switched in succession by means of a shift register 45 operating switches 46 in sequence to provide a serial output of pulses along line 47 whose magnitudes are indicative of the instantaneous current values in each of the conductors 20.

FIG. 5b illustrates a charge amplifier circuit configuration, the part shown serving two adjacent column conductors 20. In this circuit, the column conductors 20 are connected to charge amplifiers 50 with capacitive feedback whose analog outputs are similarly switched in succession by means of a shift register 45 operating switches 46 to provide on output line 47 a serial train of pulses whose magnitude is indicative of the charge flow in each column conductor. The charge amplifiers 50 are reset in the period between addressing successive rows of sensing elements by a reset pulse applied to a reset line 51 which operates switches 52 to discharge the shunt capacitors of the amplifiers.

In order to allow several readings of the capacitance image of the fingerprint, or readings of different fingerprints in consecutive operations, it is necessary to ensure that the charge on the electrodes 14 is removed or reduced before the sense elements are addressed again. This may be achieved by incorporating a resistor in each sense element connected between the sense electrode 14 and either a grounded conductor common to all sense elements of a respective row or to the next adjacent row conductor 18. Such an arrangement is shown in dotted form in FIG. 2 with the resistor and additional adjacent row conductor being referenced 15 and 17, respectively. The resistors may comprise suitably doped semiconductor material used for fabricating the TFTs.

Other approaches may, however, be employed. The predetermined voltage applied to the column conductors can be changed between two different levels on successive read cycles. The bias condition of the amplifiers can again be used to provide one of these levels. The other level may be provided by a means of a switch inserted between the conductor 20 and its associated amplifier 40 or 50. Alternatively, an intermediate reset cycle could be included in the addressing scheme.

All these approaches ensure that each time the sense elements are addressed some charging of the capacitors occurs so that the charging currents can be used to determine their capacitance.

Figure 6:
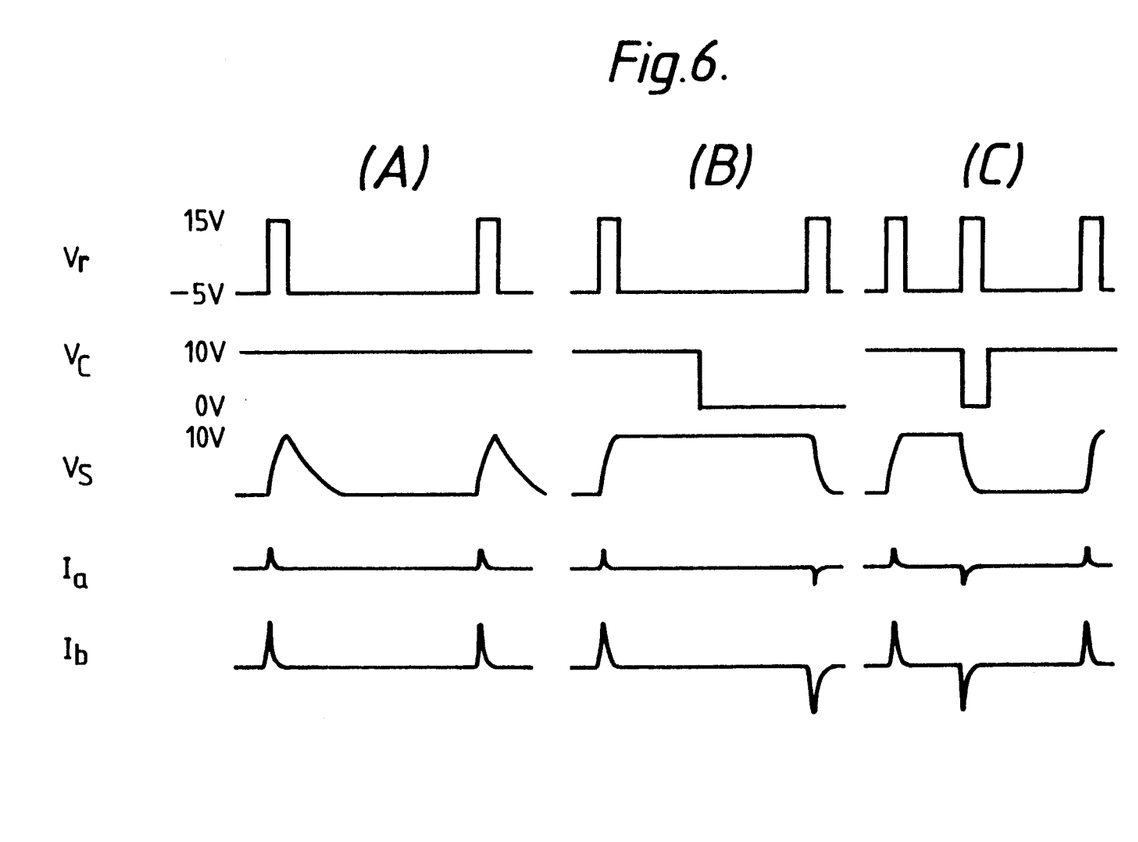

Typical waveforms present in operation of the sensing device are shown, by way of example, in FIGS. 6. More particularly three sets, A, B and C, of waveforms are shown for different modes of operation, where set A is for the version in which a resistor 15 is included in each sense element, set B is for a version in which the column voltage is inverted between successive reading cycles, and set C is for a version having an intermediate reset cycle. Vr and Vc are the voltages applied to a row conductor 18 and a column conductor 20, respectively, and Vs is the resultant voltage appearing at a sense electrode 14. Ia and Ib are the consequential currents flowing in the column conductor 20 for comparatively low and high capacitances Cx respectively. It will be appreciated that the particular voltages referred to in FIGS. 6 are by way of example only.

Figure 7A:
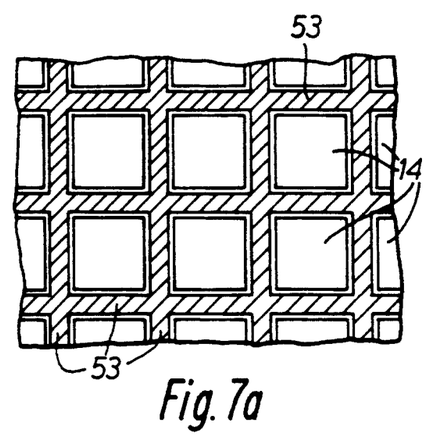
FIGS. 7a and 7b show respectively schematically in plan, two modified forms of the sensing device.
Figure 7B:
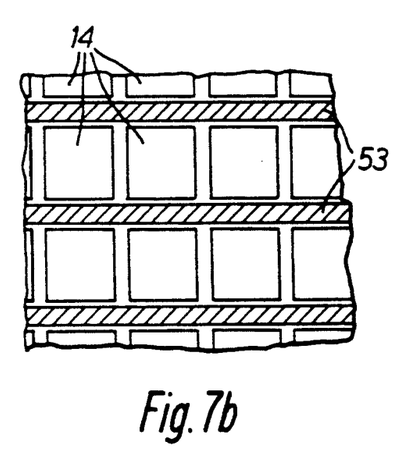

Various modifications to the sensing device are possible. In the above-described embodiment, the sensing surface, 34, is provided solely by the exposed surface of the insulating film 32. FIGS. 7a and 7b show, in schematic plan view, different forms of the sensing device in which metal film conductors 53 are deposited directly on the exposed surface of the film 32 overlying the spaces between adjacent rows and columns of sense electrodes 14, either in the form of a grid conductor pattern, FIG. 7a, or as linear conductors, FIG. 7b. In operation these conductor patterns are grounded to improve the electrical contact to the finger surface.

Figure 8:
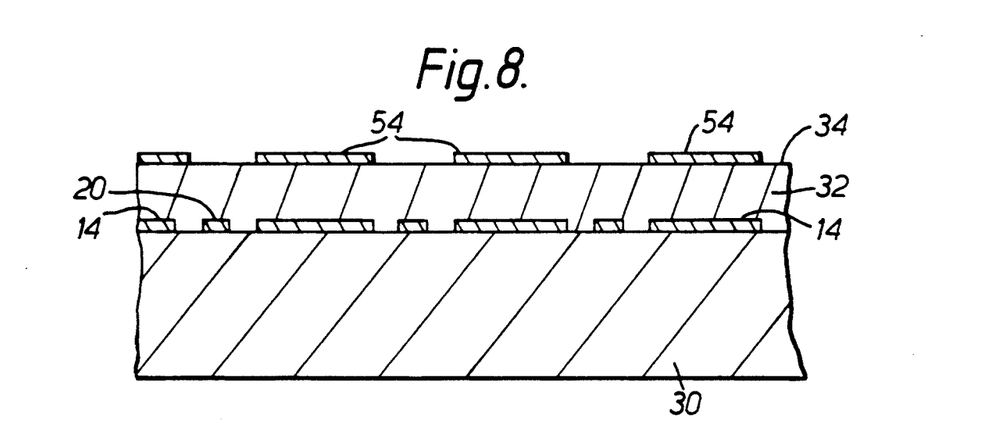
FIG. 8 is a schematic cross-sectional view through a part of another embodiment of sensing device in accordance with the invention.

Referring now to FIG. 8 there is shown a schematic cross-section view, similar to FIG. 3, through part of another embodiment of sensing device. This embodiment includes a further array of electrodes provided on the surface 34 of the insulating film 32. This array consists of discrete, electrically-isolated, conducting pads 54 approximately the same size and shape as, and substantially overlying, the sense electrodes 14. These pads 54 form, together with the electrodes 14, the opposite plates of the capacitors 35. Apart from the pads 54, this embodiment is the same as the previously-described embodiment and operation of the active matrix array of sense elements is generally identical. In use, a finger is placed over the array of pads 54 on the surface 34. Ridges of the fingerprint then contact and ground particular pads 54 of the array whereby the capacitance of the capacitors 35 at the sense elements concerned is determined by opposing electrodes 14 and 54 and the thickness of the film 32. Compared with the previous embodiment, substantially identical and more distinctive capacitances are obtained at all ridge contact locations. Elsewhere, surface portions of the finger are spaced from their underlying pads 54 and the capacitance values are dependent on this spacing as before. The capacitance variation across the array is thus indicative of the fingerprint's surface topology.

With regard to all the above-described sensing devices, the FETs 16, as previously mentioned, may comprise amorphous silicon or polycrystalline silicon TFTs fabricated using standard processes known in the art of display devices. It is envisaged though that the array of FETs 16 could instead form part of a conventional semiconductor integrated circuit using, for example, a silicon wafer substrate. However, using TFTs on an insulating substrate is considered preferable because any stray capacitance to the sense electrodes is then minimized. In addition to achieving low stray capacitance, TFT on glass/quartz technology offers the further benefit of the ability to provide relatively large area devices, around for example 30 mm by 40 m at comparatively low cost.

In the case where polycrystalline silicon is used, the addressing circuits 22 and 24 may conveniently be formed simultaneously with the FETs 16 at the periphery of the substrate 30 so as to e integrated with the active sensing matrix and provide a very compact sensing device.

Figure 9:
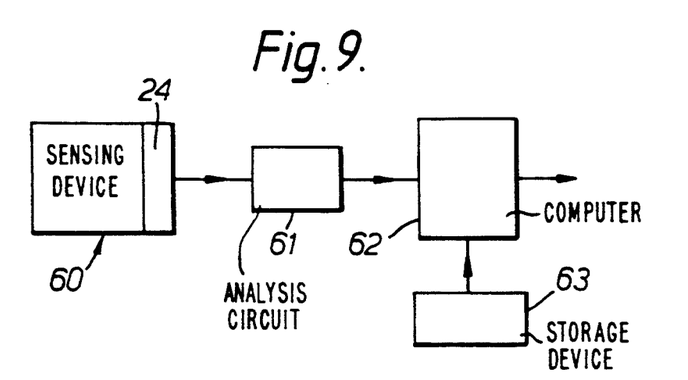
FIG. 9 is a schematic block diagram of a fingerprint recognition system incorporating a sensing device.

FIG. 9 illustrates in schematic block form a fingerprint recognition system employing a sensing device as described previously, here referenced at 60. The signal output from the sensing device 60 is in a form akin to the video type output provided by known optical type fingerprint sensing devices using image sensors. Accordingly, it will be appreciated that apart from the sensing device the components of the system generally follow conventional practice as will be apparent to persons skilled in the art, and it is considered unnecessary, therefore, to describe these components in detail. Briefly, the output from the device 60, suitably conditioned, is fed to an analysis circuit 61 which is programmed to detect characterizing features of the fingerprint sensed such as the position of minutiae. Data from the circuit 61 is supplied to a computer 62 which through standard algorithms compares the data with characteristical data of a plurality of fingerprints, or a single fingerprint depending on whether the system is used for identification or merely verification purposes, held in a storage device 63 and which provides an output in accordance with whether or not a match has been found.

The circuit 61 can be programmed either to utilize the three dimensional information provided by the sensing device for high accuracy of recognition, or alternatively, with appropriate discrimination to select particular output signal values from the device 60, utilizing specific information representative of the two dimensional ridge pattern in the nature of a binary image similar to that obtained from known optical sensing devices. From reading the present disclosure, other modifications will be apparent to persons skilled in the art. Such modifications may involve other features which are already known in the art of fingerprint recognition and which may be used instead of or in addition to features already described herein.

I claim:

1. A fingerprint sensing device, comprising:
an array of sense elements, each of which includes a sense electrode and a switching device coupled to one another, all of the sense electrodes of said sense elements being covered by dielectric material defining a sensing surface adapted to receive a finger having individual finger surface portions;
drive means coupled to all of the switching devices of said sensing elements for controlling and addressing each switching device according to a sequence independent of the fingerprint to be sensed so that a predetermined potential is applied via each switching device when addressed to the sense electrode coupled thereto; and
sensing means coupled to all of the switching devices of said sense elements for sensing capacitances based on said individual finger surface portions in combination with sense electrodes of said sense elements.

2. The device according to claim 1, wherein said drive means controls and addresses each switching device so that said predetermined potential is applied to each sense electrode at a regular interval, said predetermined potential being different than a potential present on a sense electrode having said predetermined potential applied thereto at the time said predetermined potential is applied.

3. The device according to claim 2, wherein said sensing means is adapted to sense a charging current to each sense electrode upon application thereto of said predetermined potential, and to provide an output signal in accordance therewith.

4. The device according to claim 3, wherein said sensing means comprises charge sensing amplifiers.

5. The device according to claim 3, wherein said sensing means comprises current sensing amplifiers.

6. The device according to claim 3, wherein each switching device comprises a transistor whose non-control terminals are coupled to the sense electrode coupled to that switching device and to said sensing means by a sense conductor, via which said predetermined potential is applied to the sense electrode coupled to that switching device, respectively, and whose control terminal is coupled to said drive means by an address conductor, via which a select signal is supplied from said drive means to control that switching device.

7. The device according to claim 6, wherein said sense elements are in a row and column array, and each row and column of sense elements are coupled to a common address conductor and a common sense conductor, respectively.

8. The device according to claim 7, wherein all of the switching devices of each row of said sense elements are addressed by said drive means one row at a time in sequence.

9. The device according to claim 6, wherein each transistor is a thin film transistor, and all of the transistors and sense electrodes of said sense elements together with all of the address and sense conductors associated therewith are provided on an insulating substrate.

10. The device according to claim 9, wherein the dielectric material provides an exposed surface.

11. The device according to claim 6, wherein an array of discrete electrodes is provided on the dielectric material opposite all of the sense electrodes of said sense elements, each of said discrete electrodes substantially overlying a respective sense electrode of said sense elements.

12. The device according to claim 11, wherein the dielectric material extends as a common and continuous layer over all of the sense electrodes of said sense elements.

13. The device according to claim 6, wherein the dielectric material comprises a layer extending over all of said sense electrodes of said sense elements and having a continuous surface remote from the sense electrodes of said sense elements, and conductors are provided on said continuous surface which extend over regions between the sense electrodes of said sense elements and which, in operation of the device, are grounded.

14. A fingerprint recognition system, comprising the device according to claim 6, means for providing characteristical data of a sensed fingerprint from said output signal, and means for comparing said characteristical data with stored characteristical data for one or more fingerprints.

15. A fingerprint recognition system, comprising the device according to claim 1, means coupled to said sensing means for deriving therefrom and providing characteristical data of a sensed fingerprint, and means for comparing said characteristical data with stored characteristical data for one or more fingerprints.

16. The device according to claim 1, wherein the dielectric material comprises a layer extending over all of the sense electrodes of said sense elements and having a continuous surface remote from the sense electrodes of said sense elements, and conductors are provided on said continuous surface which extend over regions between the sense electrodes of said sense elements and which, in operation of the device, are grounded.

17. The device according to claim 1, wherein an array of discrete electrodes is provided on the dielectric material opposite all of the sense electrodes of said sense elements, each of said discrete electrodes substantially overlying a respective sense electrode of said sense elements.

18. The device according to claim 1, wherein each switching device comprises a transistor whose non-control terminals are coupled to the sense electrode coupled to that switching device and to said sensing means by a sense conductor, via which said predetermined potential is applied to the sense electrode coupled to that switching device, respectively, and whose control terminal is coupled to said drive means by an address conductor, via which a select signal is supplied from said drive means to control that switching device.

19. The device according to claim 1, wherein each of said capacitances is of a capacitor which includes a capacitor dielectric positioned between opposing plates, in which one of said individual finger surface portions and the sense electrode of one of said sense elements serve as the opposing plates and in which said capacitor dielectric includes at least a portion of the dielectric material.

20. The device according to claim 19, wherein said capacitor dielectric further includes an intervening air gap between the individual finger surface portion and said at least a portion of the dielectric material.

21. The device according to claim 18, wherein said sense elements are in a row and column array, and each row and column of sense elements are coupled to a common address conductor and a common sense conductor, respectively.

22. The device according to claim 21, wherein all of the switching devices of each row of said sense elements are addressed by said drive means one row at a time in sequence.

23. The device according to claim 18, wherein each transistor is a thin film transistor, and all of the transistors and sense electrodes of said sense elements together with all of the address and sense conductors associated therewith are provided on an insulating substrate.

24. The device according to claim 2, wherein each switching device comprises a transistor whose non-control terminals are coupled to the sense electrode coupled to that switching device and to said sensing means by a sense conductor, via which said predetermined potential is applied to the sense electrode coupled to that switching device, respectively, and whose control terminal is coupled to said drive means by an address conductor, via which a select signal is supplied from said drive means to control that switching device.

25. The device according to claim 1, wherein said sensing means is adapted to sense a charging current to each sense electrode upon application thereto of said predetermined potential, and to provide an output signal in accordance therewith.

26. The device according to claim 25, wherein each switching device comprises a transistor whose non-control terminals are coupled to the sense electrode coupled to that switching device and to said sensing means by a sense conductor, via which said predetermined potential is applied to the sense electrode coupled to that switching device, respectively, and whose control terminal is coupled to said drive means by an address conductor, via which a select signal is supplied from said drive means to control that switching device.

27. The device according to claim 1, wherein said predetermined potential is supplied by said drive means.

* * * * *